US006326688B1

(12) United States Patent
Ochiai

(10) Patent No.: US 6,326,688 B1
(45) Date of Patent: Dec. 4, 2001

(54) SOCKET FOR SEMICONDUCTOR DEVICES

(75) Inventor: Toshimasa Ochiai, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/431,917

(22) Filed: Nov. 2, 1999

(30) Foreign Application Priority Data

Nov. 18, 1998 (JP) .................................................. 10-328546

(51) Int. Cl.[7] .................................................. H01L 23/12
(52) U.S. Cl. .............................. 257/731; 257/730; 257/692
(58) Field of Search ..................................... 257/731, 701, 257/730, 692; 324/755

(56) References Cited

U.S. PATENT DOCUMENTS

| 4,793,815 | * | 12/1988 | Lilov et al. | 439/77 |
|---|---|---|---|---|
| 5,237,743 | | 8/1993 | Busacco et al. . | |
| 5,530,376 | * | 6/1996 | Lim et al. | 324/765 |
| 5,543,725 | * | 8/1996 | Lim et al. | 324/755 |
| 5,572,140 | * | 11/1996 | Lim et al. | 324/755 |
| 5,705,933 | * | 1/1998 | Lim et al. | 324/755 |

FOREIGN PATENT DOCUMENTS

| 10-149868 | 6/1998 | (JP) . |
|---|---|---|
| 10-275667 | 10/1998 | (JP) . |

* cited by examiner

Primary Examiner—Roy Potter
(74) Attorney, Agent, or Firm—Burr & Brown

(57) ABSTRACT

A socket for semiconductor devices has a contact pin for a semiconductor device that is located on a top surface thereof and a contact pin for a board that is located on a bottom surface thereof, and which is placed between the semiconductor device and the board. The socket includes a socket case and a plurality of films with pins; wherein the films with pins are formed by a plurality of linear conductive elastic constituents arranged in a fixed direction on cut pieces composed of flexible electrical insulators of the same size, and both ends of the linear conductive elastic constituents extend beyond the cut pieces, protruding portions on one end constituting the contact pins for semiconductor devices, while protruding portions on the other end constituting the contact pins for the board; the contact pins for semiconductor devices have a flexure provided by a slider at one or two or more points in a lengthwise direction; an interval between adjoining ones of the contact pins for semiconductor devices is equal to a pitch of semiconductor device terminals, while an interval between adjoining ones of the contact pins for a board is equal to a pitch of terminals on the board; and the films with pins are arranged in the socket case such that surfaces of the films oppose each other, the intervals between the contact pins for semiconductor devices that protrude from adjoining films are equal to the pitch of the semiconductor device terminals, and the intervals of the contact pins for the board that protrude from adjoining films are equal to the pitch of terminals on the board.

9 Claims, 8 Drawing Sheets

SOCKET FOR SEMICONDUCTOR DEVICES

BACKGROUND OF THE INVENTION

1. Field of the Invention

The present invention relates to a socket for semiconductor devices that is placed between semiconductor devices and a burn-in board or the like in a burn-in test, etc.

2. Description of the Related Art

Most semiconductor packages employ electronic mechanism components called "sockets" placed between packages and boards to conduct testing. This type of socket for semiconductor devices usually has a spring portion known as a contact spring which provides three functions, namely, a function as a contact for semiconductor devices, a function as a spring, and a function as a terminal to be inserted in a board. Therefore, the contact spring used also as an electric circuit must be composed of a material having a low electrical resistance and also able to provide a spring load necessary when a semiconductor package is pressed against it. The spring portion of the socket for semiconductor devices is required to meet the following conditions: (1) With respect to a displacement of approximately 0.4 mm, the surface stress of the material stays within an elasticity limitation and the spring does not incur permanent set; (2) A contact load of about 10 to 15 grams is provided, or the load can be controlled freely or to a constant value with a simple parameter; and (3) The spring portion survives continuous use at 150 degrees Celsius and use of several thousands to several ten thousands of times in the case of a burn-in test.

A semiconductor package also serves to expand intervals between chip electrodes in units of microns to pitch intervals of a board in units of millimeters. Hence, conventional sockets for semiconductor devices can be easily manufactured by making contacts of millimeters in size by press molding or the like and installing them in the sockets.

In recent years, however, the trend toward a further reduced size and a higher density of electronic components is rapidly accelerating. Among BGAs, a package known as CSP in particular that has a pitch interval of 0.5 mm or less cannot be satisfactorily dealt with by a conventional method in which pins are manufactured one by one and installed in sockets, because only peripheral arrangement is possible by the conventional method. Hence, efforts have been made to develop a socket for semiconductor devices that is adaptable for pitches of higher-densities and permits easy manufacture.

For instance, as a contact portion, in addition to a contact probe type shown in FIG. 8A that has been used for long, an embedded-wire type, an implanted-conductive-particle type, cobra-structure type, and coil-spring type shown in FIGS. 8B through 8E, respectively, have been mainly used.

However, the contact probe type has extremely high manufacturing cost although it features good spring characteristics, thus limiting its application range. The embedded-wire type has been posing a problem in that a displacement required as a spring cannot be obtained; a slight displacement causes a sudden rise in load, leading to damage to a terminal of a semiconductor package. The implanted-conductive-particle type has been inconvenient in that it exhibits a high electrical contact resistance in addition to the same problem as that of the embedded-wire type. The cobra-structure type has been posing a problem in that it is no suited for burn-in tests because it has a small wire diameter and provides an insufficient spring pressure accordingly. The coil-spring type has been presenting a problem in that it exhibits high electrical resistance because of its long total length, making itself electrically disadvantageous.

In conventional sockets, press-molded springs are usually employed to secure contact between semiconductor device terminals and socket contact pins. However, the load exerted by a spring increases as a displacement thereof increases. Hence, if loads applied to semiconductor device terminals vary due to variations in size of semiconductor device terminals, then poor contact takes place in a terminal with a smaller load applied thereto, while a terminal of a solder ball or the like deforms if a larger load is applied thereto. This has been making it difficult to acquire accurate test results especially in burn-in tests. Furthermore, a press-molded spring has been presenting a shortcoming of limited adaptability for terminals having high-density pitches because the press-molded spring requires an area or volume for each pin.

In addition, the conventional type socket merely has a contact that fits a terminal pitch of a semiconductor package, and does not have a space required for accommodating the spring and the lead that have been integrally designed and press-molded; therefore, the conventional type socket cannot have a function for extension to a board. For this reason, in order to mount the socket on the board, it is necessary to accomplish fan-out by using a separate multilayer board for routing wires, posing a problem in that a burn-in test costs excessively high.

Furthermore, a terminal pitch used to be 2.54 mm in the past, whereas a present dominant terminal pitch is 1.27 mm. It is expected that the trend toward a higher density will reach a terminal pitch of about 0.5 mm to about 0.3 mm as the sizes of semiconductor packages are reduced in the future. In this case, the method employing a conventional multilayer board will further add to the cost of burn-in tests.

In addition, the spring portion of the semiconductor device socket is formed by punching a complicated shape by a press or the like, or formed by bending after punching with a press. The pitch of a fan-out portion is usually widened by bending. In most cases, therefore, producing semiconductor device sockets has been requiring efforts and high cost. The pitches of the CSP terminals, in particular, are small, presenting a problem in that producing burn-in sockets compatible with the CSP terminals requires still higher cost and more efforts because of limited machining accuracy.

SUMMARY OF THE INVENTION

Accordingly, the present invention has been made with a view toward solving the problems described above, and it is an object thereof to provide a socket for semiconductor devices which can be manufactured at lower cost and more efficiently, is applicable to a semiconductor device having a smaller pitch and adaptable to both a pitch of terminals of a burn-in board and a pitch of semiconductor device terminals, and permits a burn-in test to be conducted accurately at lower cost without the need for a multilayer board.

To this end, according to one aspect of the present invention, there is provided a socket for semiconductor devices which is placed between a semiconductor device and a board, comprising:

a contact pin for a semiconductor device that is located on a top surface thereof, a contact pin for a board that is located on a bottom surface thereof, a socket case, and a plurality of films with pins;

wherein the films with pins are formed by a plurality of linear conductive elastic constituents arranged in a fixed direction on cut pieces composed of flexible electrical insulators of the same size, and both ends of the linear conductive elastic constituents extend beyond the cut pieces, protruding portions on one end constituting the contact pins for semiconductor devices, while protruding portions on the other end constituting the contact pins for the board;

the contact pins for semiconductor devices have a flexure provided by a slider at one or two or more points in a lengthwise direction;

an interval between adjoining ones of the contact pins for semiconductor devices is equal to a pitch of semiconductor device terminals, while an interval between adjoining ones of the contact pins for a board is equal to a pitch of terminals on the board; and the films with pins are arranged in the socket case such that surfaces of the films oppose each other, the intervals between the contact pins for semiconductor devices that protrude from adjoining films are equal to the pitch of the semiconductor device terminals, and the intervals of the contact pins for the board that protrude from adjoining films are equal to the pitch of terminals on the board.

In the socket for semiconductor devices, the films with pins may be housed through the intermediary of spacers having an appropriate thickness.

Alternatively, in the socket for semiconductor devices, the socket case has a hexahedron or a cubic shape, a side wall and a top cover thereof are detachable, and the top cover has a plurality of through holes matched to the locations of the contact pins for semiconductor devices. The films with pins and the spacers are disposed in the socket case with the side wall and the top cover removed, then the side wall is reinstalled and the top cover is reinstalled to assemble the socket.

Alternatively, in the socket for semiconductor devices, the socket case has a hexahedron or a cubic shape, a top cover thereof is detachable, and the top cover and a main body thereof have a plurality of through holes matched to the locations of the contact pins for semiconductor devices. The films with pins are disposed in the main body with the top cover removed, then the top cover is reinstalled to assemble the socket.

Alternatively, the socket for semiconductor devices has spacers which have different thicknesses based on intervals of the terminals of the semiconductor devices and the board and which are placed in the vicinity of the contact pins for semiconductor devices and in the vicinity of the contact pins for the board in the films with pins.

Preferably, the flexible insulators are formed of polyimide constituents in the socket for semiconductor devices. The socket for semiconductor devices may be a burn-in socket.

In the socket for semiconductor devices, the intervals between the contact pins for semiconductor devices and the intervals of the contact pins for semiconductor devices protruding from adjoining films may range from 1.27 mm to 0.3 mm, and the intervals between the contact pins for a board and the intervals of the contact pins for a board protruding from adjoining films may range from 1.27 mm to 0.3 mm.

DESCRIPTION OF THE PREFERRED EMBODIMENTS

As shown in FIGS. 1A and 1B and FIGS. 9A and 9B, a socket for semiconductor devices in accordance with the present invention has contact pins 2 for securing contact with the semiconductor devices on a top surface thereof, and contact pins 3 for securing contact with a board for mounting the semiconductor devices thereon on a bottom surface thereof. The socket is further provided with a socket case 4 and films 5 with a plurality of pins as shown in FIG. 2 and FIG. 7.

Figure 3:
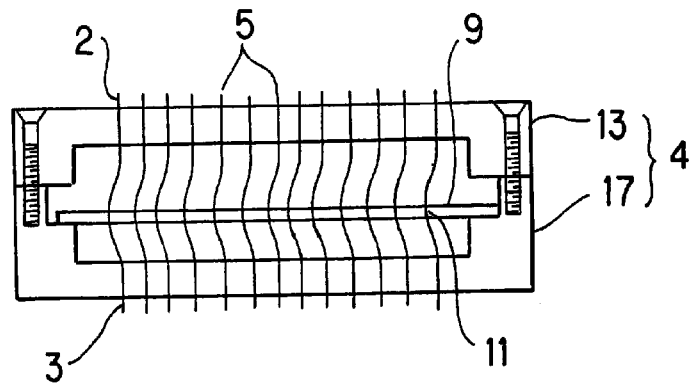
FIG. 3 is a schematic sectional view showing another example of the socket for semiconductor devices in accordance with the present invention.

The films 5 with pins are composed of cut pieces 8 which share the same size, are formed of flexible insulators, and have a plurality of linear conductive elastic constituents 7 arranged in a fixed direction. Both ends of each of the conductive constituents 7 protrude from the cut piece 8, a protruding portion on one end constituting a contact pin 2 for a semiconductor device, while a protruding portion on the other end constituting a contact pin 3 for a board. As illustrated in FIG. 3, the contact pin 2 for a semiconductor device has a flexure 11 provided by a slider 9 at one or two or more locations in the lengthwise direction thereof. The intervals of the contact pins 2 for semiconductor devices in each film 5 with pins are identical to the pitches of semiconductor device terminals, while the intervals of the contact pins 3 for a board are identical to the pitches of terminals on the board.

Figure 2:
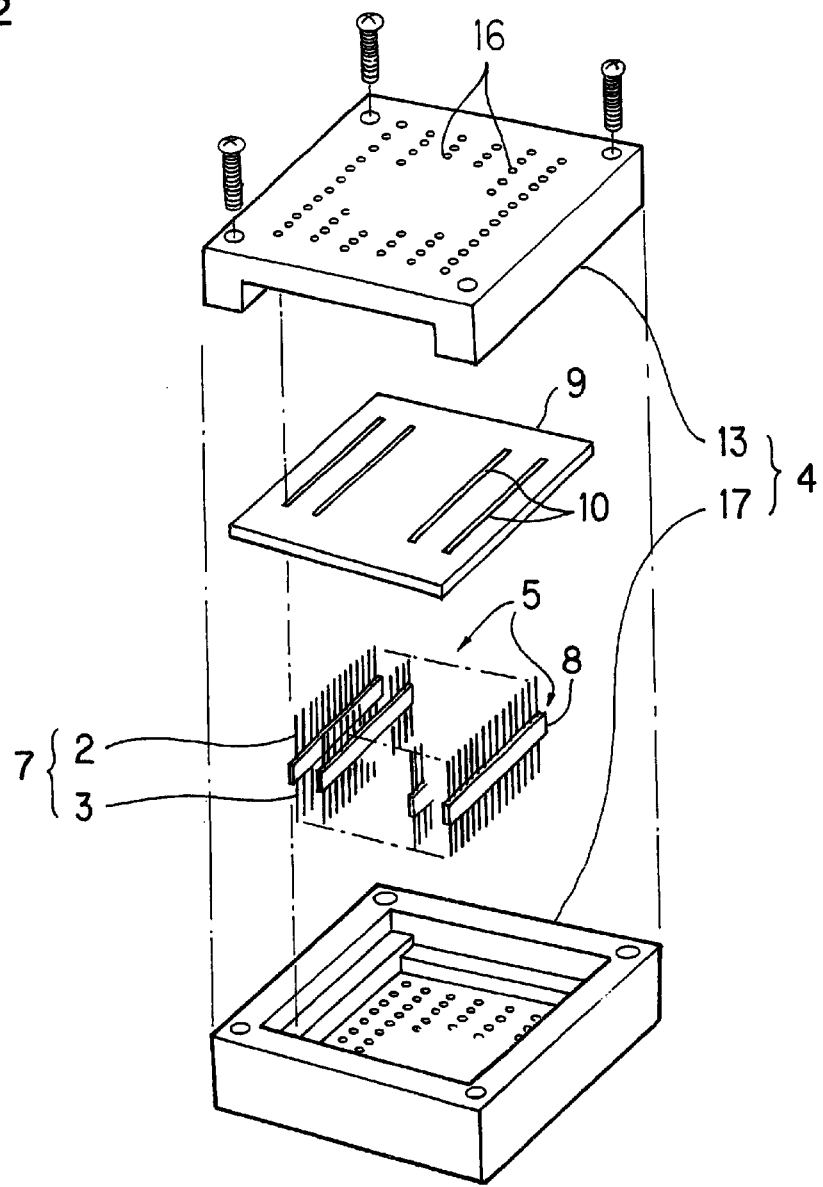
FIG. 2 is an exploded schematic diagram illustrating a structure of another example of the socket for semiconductor devices in accordance with the present invention.
Figure 7:
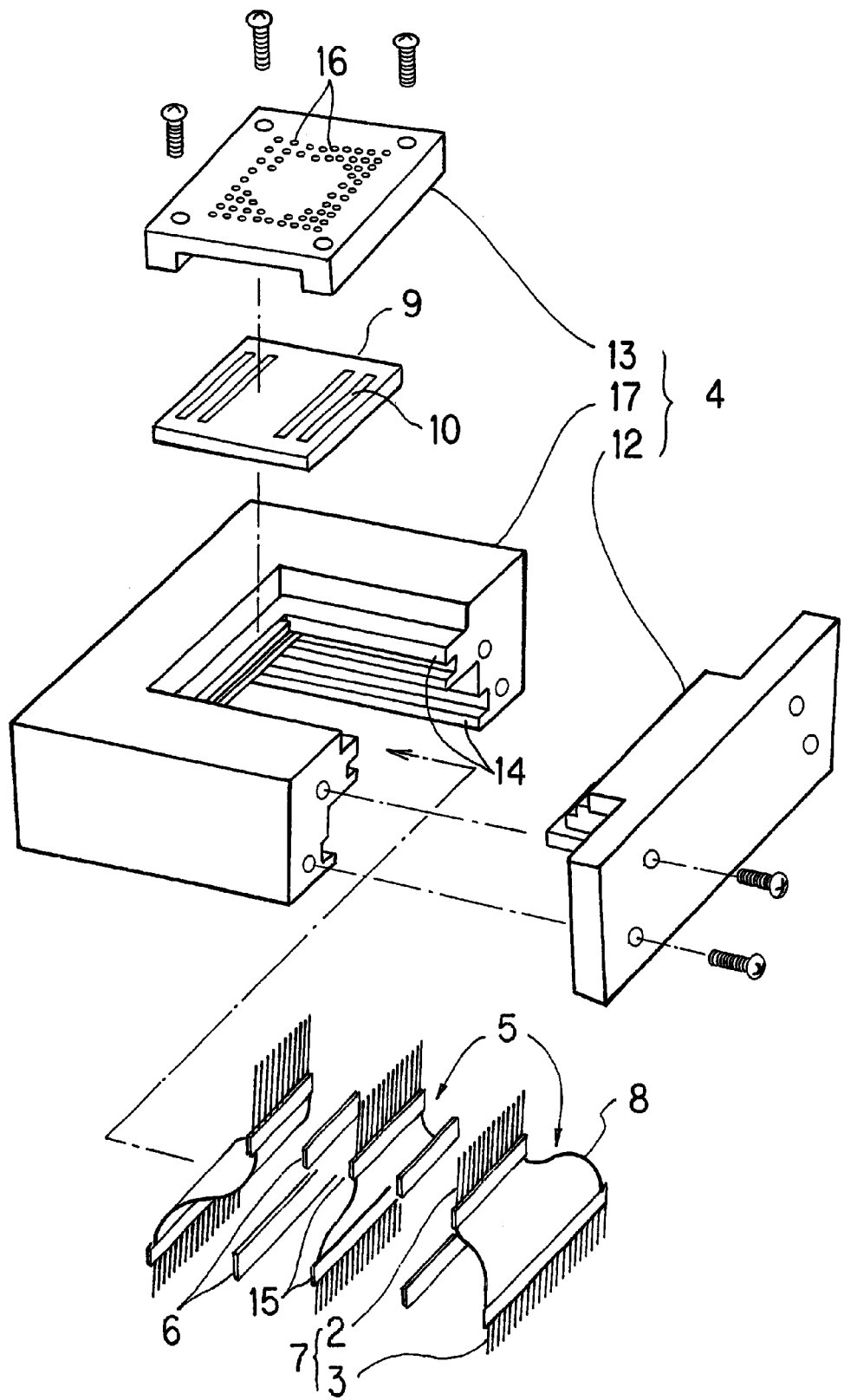
FIG. 7 is an exploded schematic diagram showing a structure of yet another example of the socket for semiconductor devices in accordance with the present invention.
Figure 8A:
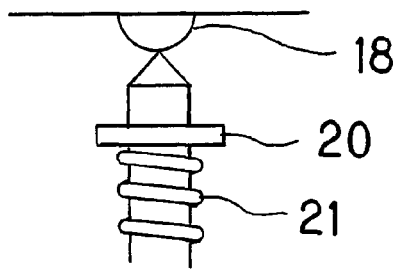
FIG. 8A is a schematic sectional view showing an example of a spring structure in a conventional socket for semiconductor devices.
Figure 8B:
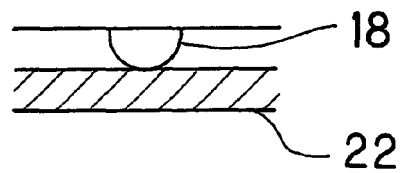
FIG. 8B is a schematic sectional view showing another example thereof.
Figure 8C:
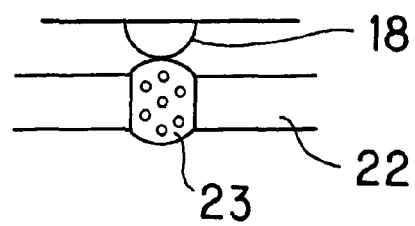
FIGS. 8C through 8E are schematic sectional views showing additional examples thereof.
Figure 8D:
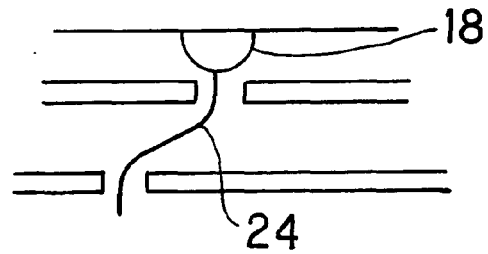
Figure 8E:
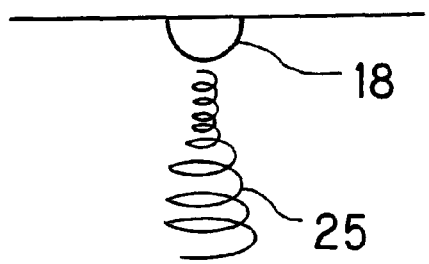

As shown in FIG. 2 and FIG. 7, the films 5 with pins are placed in the socket case 4 such that the surfaces of the films oppose each other. At this time, films 5 with pins are disposed such that the intervals of the contact pins 2 for semiconductor devices that protrude from adjacent films are equal to the pitches of semiconductor device terminals, and the intervals of the contact pins 3 for a board that protrude from adjacent films are equal to the pitches of board terminals. In this case, spacers 6 having an appropriate thickness may be provided between the films with pins as shown in FIG. 7.

Thus, the socket 1 for semiconductor devices in accordance with the present invention is adaptable for both terminal pitches of the semiconductor devices and a board. With this arrangement, semiconductor devices can be mounted on a burn-in board without the intermediary of a multilayer board in a burn-in test, permitting a reduction in cost required for the burn-in test of a CSP component.

Furthermore, the films 5 with pins can be manufactured by etching insulator films coated with an extremely thin conductive constituent of about 0.03 mm to about 0.04 mm. Hence, a socket used for a semiconductor package of about 1600 to about 2000 pins can be easily manufactured with a full grid of about 0.3 mm pitch.

Even when a semiconductor device or board having different terminal pitches is used, films with pins compatible with the pitches can be easily manufactured by extending terminals without the need for punching or bending to a complicated shape, permitting easy adaptation for different terminal pitches. Thus, the socket for semiconductor devices in accordance with the present invention can be produced at lower cost and more efficiently than conventional burn-in sockets.

Figure 4A:
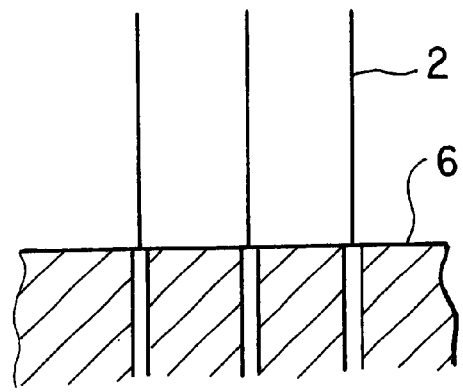
FIGS. 4A, 4B, and 4C are schematic sectional views showing an example of a slider.
Figure 4B:
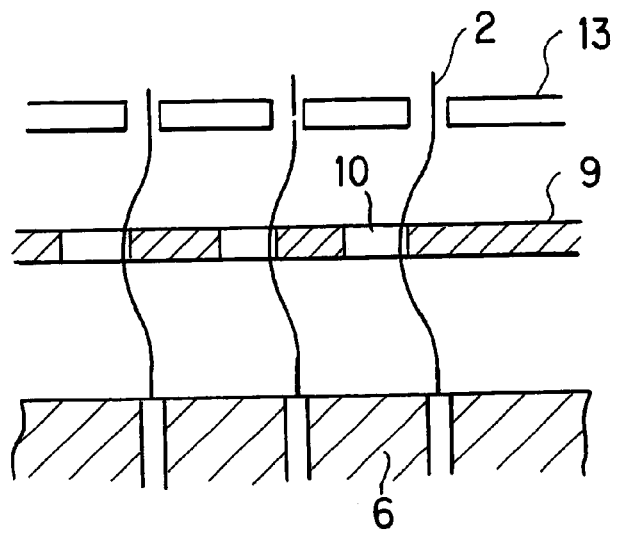
Figure 4C:
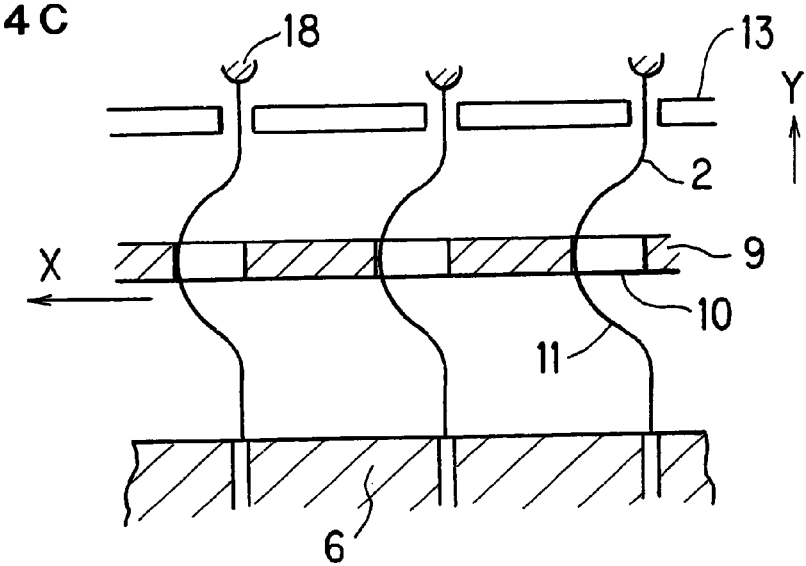

In the socket for semiconductor devices in accordance with the present invention, the conductive elastic constituents of the film 5 with pins are linear before the slider 9 is installed as shown in FIG. 4A. In FIG. 4B, the conductive elastic constituents are curved in a fixed direction by the slider 9, so that they positively produce flexures 11 in a fixed direction by loads applied by semiconductor device terminals 18 as shown in FIG. 4C. If an arrangement is made so that the slider 9 moves when the contact pins 2 touch edges of slits 10 of the slider 9, then a larger displacement in a direction of an X-axis can be successfully coped with, allowing a larger displacement also in a direction of a Y-axis to be coped with.

The conductive elastic constituents of the film 5 with pins function as buckling springs pressing against the semiconductor device terminals 18 because of the elasticity thereof, thus assuring electrical contact between the semiconductor device terminals 18 and the contact pins 2 for semiconductor devices.

In a conventional socket, diverse types of press-formed springs are usually employed to ensure the electrical contact with semiconductor device terminals. The simplified construction according to the present invention requires a smaller width as compared with a construction using press-formed springs, enabling the construction to be easily compatible with a full grid array having a pitch of 0.5 mm or less. Moreover, since no bending or other similar machining is required, higher production efficiency of sockets can be achieved. In particular, 0.3 mm-pitch sockets conventionally requiring extremely high production cost can be manufactured more efficiently at lower cost.

In a structure that makes use of the flexure of the elastic constituents of the socket in accordance with the invention, any load and displacement can be obtained by precisely controlling the thickness, width, and the length and the number of flexures of the elastic constituents. In a socket 1 for semiconductor devices according to the invention, the flexure portions are required to satisfy the following major conditions: (1) The surface stress of the material thereof stays within elasticity limitation with respect to a displacement of approximately 0.4 mm, and does not develop permanent set; (2) Provides a contact load ranging from about 10 grams to about 15 grams, or permits load to be controlled freely or to a fixed level by a simple parameter; and (3) Survives continuous use at 150 degrees Celsius and use of several thousands to several ten thousands of times in the case of a burn-in test. For instance, when the contact pins 2 employs beryllium copper and is formed to have a length of 0.04 mm and a width of 0.3 mm, the conditions listed above can be satisfied by providing one to four flexures over a length of 3 mm to 10 mm.

The socket in accordance with the invention is also advantageous in that the structure described above makes it possible to apply a virtually constant load to semiconductor device terminals independently of the magnitudes of displacements of the contact pins. In the case of a typical spring, load increases as displacement increases. This is inconvenient as set forth below in the case of an extremely small semiconductor device socket. There are some variations in the sizes of semiconductor device terminals due to different manufacturing capabilities of different manufacturers. If the differences in sizes of the semiconductor device terminals cause different loads to be applied to semiconductor device terminals, then poor contact takes place in terminals subjected to smaller loads, whereas terminals subjected to larger loads are deformed, making it difficult to acquire accurate test results especially in case of a burn-in test. The socket in accordance with the present invention is able to apply a constant load to semiconductor device terminals even if there are variations in the sizes of semiconductor device terminals, thus permitting an accurate burn-in test to be carried out.

Figure 5A:
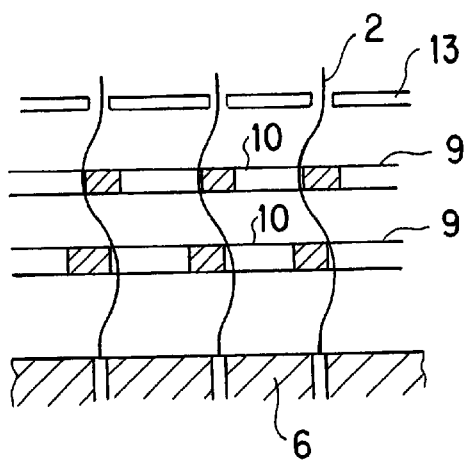
FIG. 5A is a schematic sectional view showing another example of the slider.
Figure 5B:
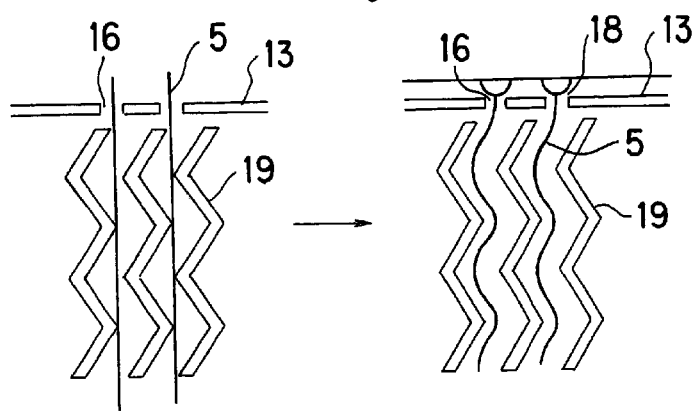
FIGS. 5B, 5C, and 5D are schematic diagrams showing an example of a wavy guide.
Figure 5C:
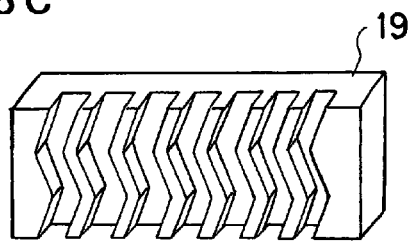
Figure 5D:
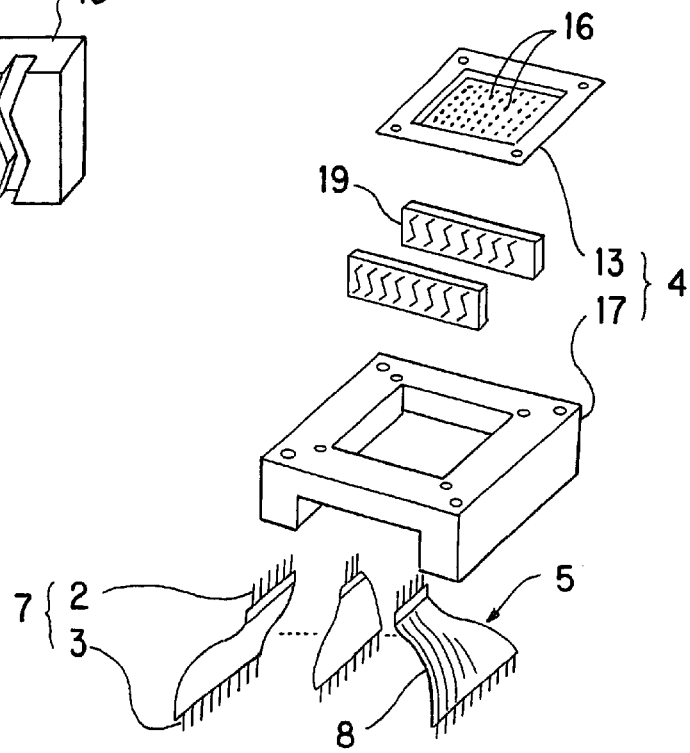
Figure 6:
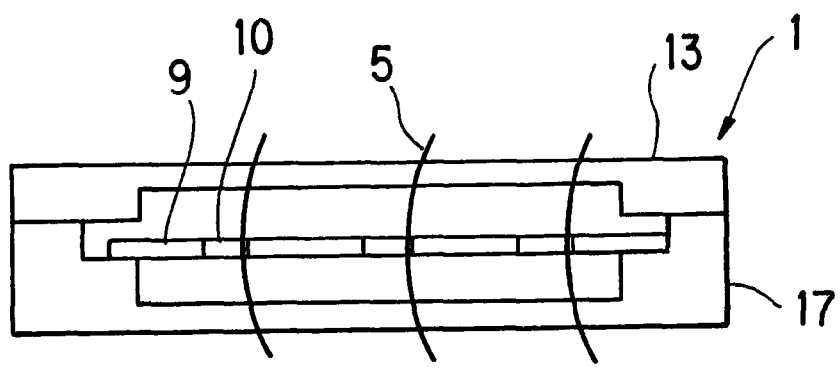
FIG. 6 is a schematic sectional view showing still another example of the socket for semiconductor devices in accordance with the present invention.

The slider 9 has a structure as shown in FIG. 2, wherein slits 10 are formed in a plate, which is made of, for example, a PES or a polymer containing glass, such that they match the size and locations of the films 5 with pins. To provide a plurality of flexures, the slits 10 are formed such that adjoining sliders 9 come in contact with different surfaces of the film 5 with pins as illustrated in FIG. 5A. The slits 10 are provided with widths that are sufficiently large to cope with flexures of the films 5. Preferably, one to three sliders 9 are provided at intervals of 2 mm to 3 mm. As illustrated in FIG. 5B, wavy guides 19 shown in FIG. 5C may be inserted in a direction to intersect with the films 5 having pins as illustrated in FIG. 5D in order to control the positions, the number, and the amounts of flexures. Furthermore, in the semiconductor device socket according to the invention, the contact pins may have a structure shown in FIG. 6 that has no portions that are linearly restricted. This structure enables the height of the semiconductor device socket to be reduced.

In the present invention, the elastic insulator constituting the film 5 with pins is required to exhibit resistance to heat and weather, etc. For this reason, a rubber such as a silicone rubber or a synthetic rubber, or a resin such as a polymer, a polyimide, or an engineering resin is preferably used. It is particularly preferable to use a polyimide constituent that features high resistance to heat when used for a burn-in socket.

Preferably, the thickness of the film ranges from 0.025 mm to 0.075 mm because of the following reason. If the film thickness is less than 0.025 mm, the film with pins will not be sufficiently strong, and therefore fail to provide necessary rigidity. Conversely, if the film thickness exceeds 0.075 mm, the thickness of the film itself will make it difficult to accomplish natural curves during assembly.

The conductive elastic constituent forming the film 5 with pins is required to have elasticity or springiness, resistance to heat, fatigue property, etc. in addition to conductivity. As the conductive elastic constituent, beryllium copper, phosphor bronze, titanium copper, copper nickel tin alloy, nickel beryllium, etc. are desirably used. For use as a burn-in socket, it is especially desirable to use beryllium copper exhibiting high resistance to heat.

The thickness of the conductive elastic constituent preferably ranges from 0.01 mm to 0.10 mm, and more preferably ranges from 0.002 mm to 0.005 mm. If the thickness is less than 0.01 mm, an inconvenience will arise in which a spring pressure cannot be obtained. Conversely, if the thickness exceeds 0.10 mm, then it will be difficult to decrease the pitches of contact pins whether etching or press-cutting is used. In the case of etching, if the thickness is 0.04 mm, it is possible to obtain a pin width of 0.1 mm and a pin interval of 0.1 mm, that is, a pitch of 0.2 mm.

The present invention will be described in further detail in conjunction with illustrated embodiments; the invention, however, is not limited to the embodiments.

First Embodiment

A socket for semiconductor devices that has 41 columns by 41 rows, i.e. 1681 pins, the intervals of contact pins on the board side and the semiconductor device side being the same, was assembled as illustrated in FIG. 2.

First, a top cover 13 of a hexahedron socket case 4 having the detachable top cover 13 was removed, and forty-one films 5 with pins were disposed therein. The socket case 4 measures 40 mm long, 40 mm wide, and 8 mm high, and employs a PES polymer. Each of the films 5 with pins was composed of a rectangular film which measures 1.0 mm long and 32 mm wide and which is made of a polyimide, the thickness thereof being 0.075 mm. Forty-one conductive constituents 7 formed of beryllium copper, each thereof measuring 9 mm long, 0.28 mm wide, and 0.04 mm thick, were disposed on the foregoing films at intervals of 0.5 mm in a fixed direction on both semiconductor device side and board side.

All of the films 5 with pins were disposed in the socket case 4, then one slider 9 was installed therein, and the top cover 13 was attached. The slider 9 is formed of a polymer, and measures 26 mm long, 28 mm wide, and 1.0 mm thick. The slider 9 was provided with forty-one slits 10 matched to the locations of the contact pins 2 for semiconductor devices, each slit 10 measuring 0.3 mm wide and 22 mm long. The top cover 13 and a main body 17 are respectively provided with 1,681 through holes 16 matched to the locations of the contact pins 2 for semiconductor devices and the contact pins 3 for a board, each of the through holes 16 having a diameter of 0.3 mm.

Figure 1A:
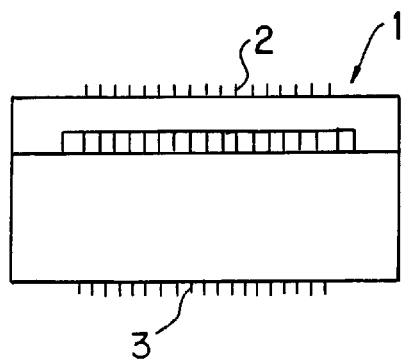
FIGS. 1A and 1B are a front view and a side view, respectively, showing an example of a socket for semiconductor devices in accordance with the present invention.
Figure 1B:
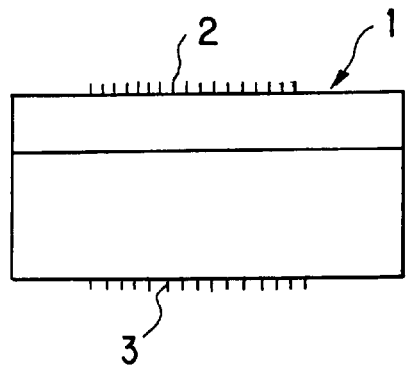
Figure 1C:
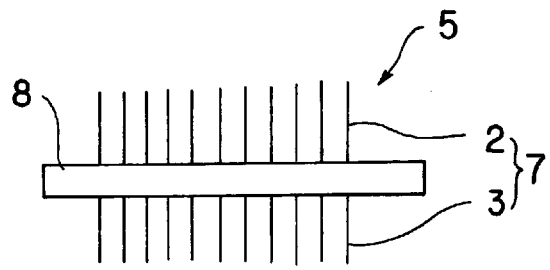
FIGS. 1C and 1D are a front view a side view, respectively, showing an example of a film with pins.
Figure 1D:
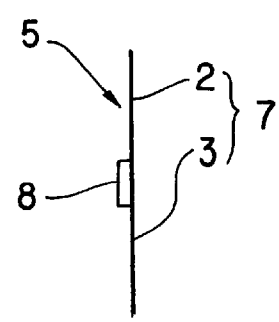

In the socket 1 for semiconductor devices shown in FIG. 1A and FIG. 1B, the length of the contact pins 2 for semiconductor devices that protrude from the insulator film 8 was 4 mm, while the length of the contact pins 3 for a board that protrude from the insulator film 8 was 4 mm. Furthermore, the lengths of both types of contact pins protruding from the socket case 4 were approximately 0.25 mm.

Various semiconductor devices were mounted on the socket 1 for semiconductor devices, and the displacements of the contact pins 2 for semiconductor devices and loads applied to the semiconductor device terminals were measured. Good measurement results have been obtained, the loads ranging from 11 grams to 15 grams with respect to displacements ranging from 0.1 mm to 0.4 mm.

Second Embodiment

Figure 9:
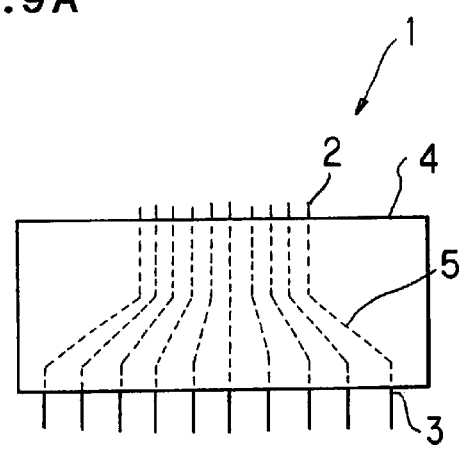
FIGS. 9A and 9B are a front view and a side view, respectively, showing a further example of the socket for semiconductor devices in accordance with the present invention.
FIGS. 9C and 9D are a front view and a side view, respectively, showing a further example of a film with pins.
Figure 9:
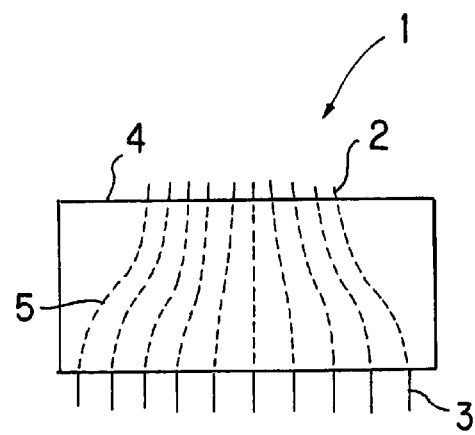
Figure 9:
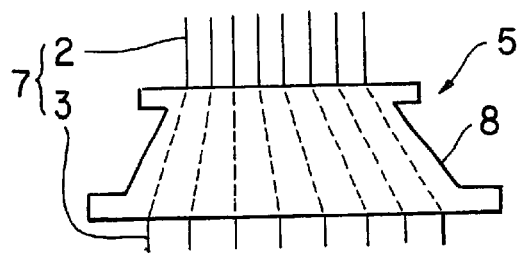
Figure 9:
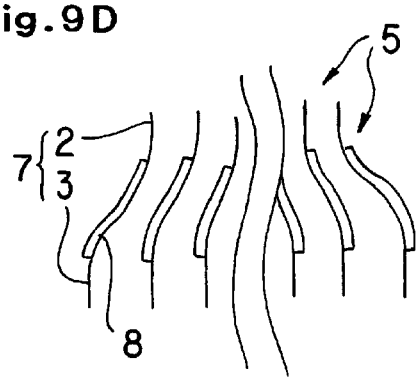

In the same manner as that for the first embodiment, a socket for semiconductor devices having 1,681 pins (41 columns×41 rows) was assembled as shown in FIG. 7 and FIG. 9. In the second embodiment, the intervals of the contact pins on the board side are larger than the intervals of the contact pins on the semiconductor device side. A socket case 4 has a detachable side wall 12 and a detachable top cover 13. The side wall 12 and the top cover 13 were removed, and forty-one films 5 with pins were disposed in the socket. The films 5 with pins are shaped in trapezoids, each trapezoid having a top side of 36 mm, a bottom side of 56 mm, and a height of 13 mm to 25 mm. Forty-one conductive constituents 7 were disposed on each film in a fixed direction at 0.3 mm intervals on the semiconductor device side and at 1.27 mm intervals on the board side.

The films 5 with pins were disposed with the intermediary of spacers 6 placed between films; spacers having a thickness of approximately 0.43 mm were provided in the vicinity of the contact pins 2 for semiconductor devices, while spacers having a thickness of approximately 1.2 mm were provided in the vicinity of the contact pins 3 for a board. The spacers 6 were installed such that intervals between the contact pins 2 for semiconductor devices that protrude from adjoining films with pins were eventually set to 0.3 mm, while intervals between the contact pins 3 for a board that protrude from adjoining films with pins were eventually set to 1.27 mm. Two engaging portions 14 are provided in the socket case 4, one each at top and bottom, in a direction in which the films 5 with pins are arranged, and lateral protruding portions 15 provided at top and bottom ends of the polyimide film and the spacers 6 were engaged onto the engaging portions 14 thereby to fix the films 5 with pins and the spacers 6 in the socket case 4.

Various semiconductor devices were mounted on the socket 1 for semiconductor devices, and the displacements of the contact pins 2 for semiconductor devices and loads applied to the semiconductor device terminals were measured. Good measurement results have been obtained, the loads ranging from 11 grams to 15 grams with respect to displacements ranging from 0.1 mm to 0.4 mm.

The socket for semiconductor devices in accordance with the present invention can be manufactured by etching without the need for a bending process. Hence, if foil having a thickness of, for example, 40 $\mu$m, is used, a socket with a higher density and an extremely small pitch (a full grid of 1,681 pins at 0.3-mm pitches) can be easily manufactured.

Moreover, since loads are applied to semiconductor device terminals by making use of the flexure developed in the films with pins, the socket can be easily adapted for arrays having pitches of 0.5 mm or less. Furthermore, the production efficiency of sockets can be improved. In addition, any desired loads and displacements can be obtained by precisely controlling the positions and the number of flexures, and loads of a constant level can be applied to semiconductor device terminals even if there are variations in sizes of semiconductor device terminals. This arrangement prevents dispersion in data attributable to poor contact or deformation of solder balls, etc. in a burn-in test, permitting an accurate burn-in test to be conducted.

Furthermore, since the socket is able to successfully fit terminal pitches of both semiconductor devices and a board, semiconductor devices can be mounted on a burn-in board without the intermediary of a multilayer board in, for example, a burn-in test, thus permitting a reduction in cost required for conducting a burn-in test of a CSF component.

When semiconductor devices or boards with different terminal pitches are used, films with pins compatible with new terminal pitches can be easily manufactured, so that different terminal pitches can be easily coped with, and sockets for semiconductor devices can be efficiently manufactured at lower cost than conventional burn-in sockets.

What is claimed is:

1. A socket for semiconductor devices which is placed between a semiconductor device and a board, comprising:
   a contact pin for a semiconductor device that is located on a top surface thereof,
   a contact pin for a board that is located on a bottom surface thereof,
   a socket case, and
   a plurality of films with pins;
   wherein the films with pins are formed by a plurality of linear conductive elastic constituents arranged in a fixed direction on cut pieces composed of flexible electrical insulators of the same size, and both ends of the linear conductive elastic constituents extend beyond the cut pieces, protruding portions on one end constituting the contact pins for semiconductor devices, while protruding portions on the other end constituting the contact pins for the board;
   the contact pins for semiconductor devices have a flexure provided by a slider at one or two or more points in a lengthwise direction;
   an interval between adjoining ones of the contact pins for semiconductor devices is equal to a pitch of semiconductor device terminals, while an interval between adjoining ones of the contact pins for a board is equal to a pitch of terminals on the board; and
   the films with pins are arranged in the socket case such that surfaces of the films oppose each other, the intervals between the contact pins for semiconductor devices that protrude from adjoining films are equal to the pitch of the semiconductor device terminals, and the intervals of the contact pins for the board that protrude from adjoining films are equal to the pitch of terminals on the board.

2. A socket for semiconductor devices according to claim 1, wherein the films with pins are housed through the intermediary of spacers having an appropriate thickness.

3. A socket for semiconductor devices according to claim 1, wherein;
   the socket case has a hexahedron or a cubic shape;
   a side wall and a top cover are detachable;
   the top cover has a plurality of through holes matched to the locations of the contact pins for semiconductor devices; and
   the films with pins and the spacers are disposed in the socket case with the side wall and the top cover removed, then the side wall is reinstalled and the top cover is reinstalled to assemble the socket.

4. A socket for semiconductor devices according to claim 1, wherein;
   the socket case has a hexahedron or a cubic shape;
   the top cover is detachable,
   the top cover and a main body have a plurality of through holes matched to the locations of the contact pins for semiconductor devices; and
   the films with pins are disposed in the main body with the top cover removed, then the top cover is reinstalled to assemble the socket.

5. A socket for semiconductor devices according to claim 2, wherein spacers which have different thicknesses based on intervals of the terminals of the semiconductor devices and the board are placed in the vicinity of the contact pins for semiconductor devices and in the vicinity of the contact pins for the board in the films with pins.

6. A socket for semiconductor devices according to claim 3, wherein spacers which have different thicknesses based on intervals of the terminals of the semiconductor devices and the board are placed in the vicinity of the contact pins for semiconductor devices and in the vicinity of the contact pins for the board in the films with pins.

7. A socket for semiconductor devices according to claim 1, wherein the flexible insulators are formed of polyimide constituents.

8. A socket for semiconductor devices according to claim 1, wherein the socket for semiconductor devices is a burn-in socket.

9. A socket for semiconductor devices according to claim 1, wherein;
   the intervals between the contact pins for semiconductor devices and the intervals of the contact pins for semiconductor devices that protrude from adjoining films range from 0.8 mm to 0.3 mm; and
   the intervals between the contact pins for a board and the intervals of the contact pins for a board that protrude from adjoining films range from 2.54 mm to 0.3 mm.

* * * * *